United States Patent [19]

Berman

[11] Patent Number: 4,510,344

[45] Date of Patent: Apr. 9, 1985

[54] THIN FILM SOLAR CELL SUBSTRATE

[75] Inventor: Elliot Berman, Los Angeles, Calif.

[73] Assignee: Atlantic Richfield Company, Los Angeles, Calif.

[21] Appl. No.: 562,942

[22] Filed: Dec. 19, 1983

[51] Int. Cl.³ .............................................. H01L 31/06
[52] U.S. Cl. ....................................... 136/256; 29/572; 65/30.13; 65/31; 357/30
[58] Field of Search .................. 136/256; 357/30; 427/166, 168, 169, 309, 108–110, 126.2; 428/432; 65/30.13, 31; 29/572

[56] References Cited

U.S. PATENT DOCUMENTS

| 2,486,431 | 11/1949 | Nicoll et al. | 156/663 |
| 2,490,662 | 12/1949 | Thomsen | 156/626 |
| 3,677,814 | 7/1972 | Gillery | 427/108 |
| 3,880,633 | 4/1975 | Jordan et al. | 65/60 |
| 3,991,228 | 11/1976 | Carlson et al. | 427/39 |
| 4,146,657 | 3/1979 | Gordon | 427/126 |
| 4,292,092 | 9/1981 | Hanak | 148/1.5 |
| 4,371,740 | 2/1983 | Clem | 136/256 |

Primary Examiner—Aaron Weisstuch
Attorney, Agent, or Firm—Albert C. Metrailer

[57] ABSTRACT

An improved low cost photovoltaic cell including a sodium containing glass substrate which has been chemically treated to remove sodium ions from a surface selected for deposition of a transparent conductor.

2 Claims, 1 Drawing Figure

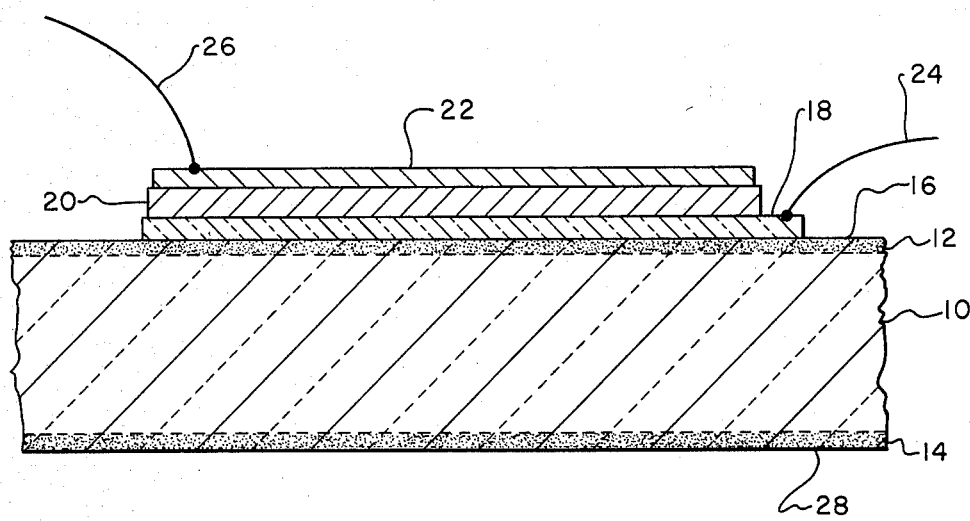

THIN FILM SOLAR CELL SUBSTRATE

BACKGROUND OF THE INVENTION

This invention relates to thin film solar cells and more specifically to improvements in substrates for such cells which allows the use of low cost glass substrates in combination with high conductivity transparent conductors.

Considerable research and development has been directed towards development of commercially practical thin film solar cells. In such cells the semiconductor material, typically silicon, is on the order of 0.5 micron thick as compared to conventional single crystal silicon wafers having a thickness on the order of 250 microns. Thus a considerable savings in semiconductor material is achieved by use of thin film structures. Further savings are anticipated because thin film processes are usually more easily automated so that the labor costs per watt of output power should be considerably less than that required for the conventional cells.

An example of thin film solar cell structures is illustrated in U.S. Pat. No. 4,292,092 issued to Hanak on Sept. 29, 1981. The Hanak structure employs a glass substrate, a transparent front conductor deposited and patterned on the glass substrate, a thin semiconductor film and a metallic back contact. The performance of such cells is quite dependent upon the sheet resistivity of the transparent conductor which forms the front contact for the active regions of the solar cell. One of the primary teachings of Hanak is a laser scribing technique used to break the sheet of semiconductor material into a series of long narrow strips which are series connected to add the voltages from the individual cells while limiting the maximum current which must be carried by the various conductors. However, scribing of the material into the individual cells results in loss of some of the active area which loss must be balanced against the power savings achieved by reduction of current levels. As the sheet resistivity of the transparent conductor is reduced, the width of the individual cells can be increased, thereby reducing inactive area resulting from scribed lines as well as reducing labor and other costs of manufacture.

U.S. Pat. No. 3,677,814 issued to Gillery on July 18, 1972 teaches a method of applying tin oxide layers to glass substrates, which methods are generally applicable to thin film solar cell processes. Gillery provides examples involving the use of soda lime glass as a substrate for formation of tin oxide transparent conductors. However Gillery also teaches that lower film resistivity can be achieved if other types of glass which can be processed at high temperatures are employed.

U.S. Pat. No. 4,146,657 issued to Gordon on Mar. 27, 1979 teaches other improvements in formation of tin oxide layers on glass, which improvements are directed towards considerable reduction in sheet resistivity of the tin oxide layers. Most of the examples provided by Gordon involve the use of Pyrex glass plate as a substrate. In example 2 Gordon notes that when a "sodium free silicon substrate" is used the sheet resistivity is about one-half that achieved with a sodium bearing substrate.

The cost of the glass substrate is a major component of the total cost of the finished product. While it is desirable to achieve the lowest sheet resistivity possible in the transparent conductive layer, the cost of high temperature glass, such as Pyrex, cannot be economically justified. While lost cost and freely available soda lime glass has proven to have quite acceptable mechanical characteristics from its use in conventional solar modules, its high sodium content increases transparent conductor sheet resistivity with the adverse results discussed above.

Thus it is seen that it is desirable to provide an improved low cost soda lime glass useful in thin film solar cells or to provide a method for treating such glass substrates to prevent the adverse effects sodium ions are known to have on resistivity of tin oxide layers.

SUMMARY OF THE INVENTION

Accordingly an object of the present invention is to provide an improved low cost thin film solar cell substrate comprising essentially soda lime glass.

Another object of the present invention is to provide improved methods for forming low resistivity transparent conductors on sodium containing glass substrates.

Yet another object of the present invention is to provide an improved, low cost thin film solar cell including a sodium containing glass substrate.

According to the present invention a thin film solar cell is formed on a low cost sodium containing glass substrate which has been pretreated to remove sodium ions from the surface selected for deposition of the transparent conductor layer. In a preferred form both major surfaces of the glass substrate are treated simultaneously in an antireflection layer generating etch process to remove sodium ions. In an alternate embodiment, sodium ions first are replaced with potassium ions in a chemical tempering process and the antireflection layer generating process is then used to remove potassium and any remaining sodium from the near surface.

BRIEF DESCRIPTION OF THE DRAWING

The present invention may be better understood by reading the following detailed description of the preferred embodiment with reference to the accompanying single FIGURE which illustrates a basic thin film solar cell device in accordance with the present invention.

DETAILED DESCRIPTION OF THE INVENTION

With reference now to the FIGURE there is illustrated a basic solar cell structure including the improvements of the present invention. The basic mechanical support for the device is provided by a glass substrate 10 formed from conventional soda lime glass about two millimeters thick. Thin layers 12 and 14 have been chemically treated as indicated by the stippling shown on the drawing. Details of the chemical treatment are discussed in more detail below. On a surface 16 of glass substrate 10 there is formed a transparent conductive layer 18. Layer 18 is typically 0.2 to 0.3 microns thick and is formed primarily of tin oxide. The tin oxide layer 18 will typically be doped with various materials such as fluorine or indium to improve conductivity as discussed in the above referenced Gillery and Gordon patents. Supported on transparent conductor 18 is a thin film semiconductor layer 20 containing a p-n junction and forming the active portion of the solar cell. Layer 20 is typically formed from silicon and may be from 0.4 to 0.5 microns thick. Layer 20 may be deposited as three distinct layers, that is a p layer, an i layer, and an n layer as discussed in the above referenced Hanak patent. However other active region structures may be employed in the present invention. A back conductor 22 is formed on the semiconductor layer 20 and may be formed from any type of high conductivity metal. For example, layer 22 may be formed by a vacuum evaporation or sputtering of aluminum to a thickness of about 0.1 micron onto the top surface of the active layer 20. External leads 24 and 26 are provided to connect the front face and back face contacts 18 and 22, respectively, to an external circuit for utilization of power generated by the semiconductor layer 20.

In the present invention improved performance is achieved by increasing the conductivity of transparent conductor 18 while costs are reduced by using a low cost soda lime glass substrate 10. We have found that this is possible by use of a glass substrate 10 which has been properly pretreated to remove sodium ions from the layer 12 on which transparent conductor 18 is deposited as illustrated in the drawing. Layer 12 is typically at least about 0.1 microns thick. In most cases the thickness of layer 12 will actually be determined by the thickness of layer 14 which will normally be formed in the same process step. Layer 14 thickness will be selected for optimum antireflection effect. Sodium ions may be removed from layers 12 and 14 by various well known processes. U.S. Pat. No. 2,486,431, issued to F. H. Nicoll et al, on Nov. 1, 1949, and U.S. Pat. No. 4,490,662 issued to S. M. Thompsen on Dec. 6, 1949 teach the use of fluosilicic acid supersaturated with silica for removing sodium and calcium from glass surfaces and are hereby incorporated by reference for such teachings.

The same or similar sodium ion removal processes are commercially available for providing an antireflective surface on glass such as that used in the preferred embodiments. Thus for example the layer 14 illustrated in the FIGURE is desirably treated in the same manner as layer 12 but for a different purpose. That is, by reducing light reflections at the surface 28, which is the light receiving face of the finished device, more power will be produced by the finished solar cell. In practice it is actually more expensive to treat only one surface, for example surface 16, that it is to treat both surfaces simultaneously. Treatment of only one surface would require an additional step to provide a protective coating to the opposite layer during the treatment process, thereby increasing the costs.

In applications where substrate 10 is the major mechanical support for the finished photovoltaic device, it is desirable that it have the maximum mechanical strength achievable. Tempered glass is quite desirable for this application. In a known chemical tempering process for such glass, the sodium ions are replaced by potassium ions. For maximum strength, this process should be applied to both layers 12 and 14 to a depth of about 100 microns. As with the sodium removal step it is, in practice, less expensive to perform the tempering process on both surfaces simultaneously rather than to attempt to treat only one surface. Commercially available ion exchange strengthening processes are carried out in molten salt baths. One method involves lowering the surface coefficient of thermal expansion, by ion exchange, while glass is at an elevated temperature, usually above the strain point. Another strengthening mechanism relies on replacement of small ions by larger ions and is carried out below the strain point. In either case, surface compression is achieved and strengthens the glass. In this embodiment, the chemical tempering process will be performed before the ion removing etch process discussed above. The etch process will then be used to remove any remaining sodium ions as well as the potassium ions from the near surface portion of the glass, that is to a depth of about 0.1 micron.

While the present invention has been illustrated and described with respect to particular structures and methods of construction, it is apparent that various modifications and changes can be made therein within the scope of the present invention as defined by the appended claims.

What is claimed is:

1. In a photovoltaic solar cell of the type including a glass substrate, a tin oxide transparent conductor deposited on said substrate, a thin film semiconductor layer deposited on said transparent conductor, and a second conductor deposited on said semiconductor layer, the improvement comprising:

said glass substrate containing a substantial percentage of sodium oxide, which substrate has been chemically treated, on at least the surface selected to support the transparent conductor, to:
  (a) replace sodium ions with potassium ions to a depth of about 100 microns and
  (b) thereafter, remove any remaining sodium ions from said surface to a depth of at least about 0.1 micron.

2. A thin film photovoltaic cell comprising:

a transparent sodium containing glass substrate having at least a first major surface which has been first chemically treated to replace sodium ions with potassium ions to a depth of about 100 microns and thereafter chemically treated to remove any remaining sodium ions from said first major surface to a depth of at least about 0.1 micron, a thin film of transparent conductor deposited on said first major surface, said transparent conductor consisting primarily of tin oxide, a layer of semiconductor material, including an active junction, deposited on said transparent conductor; and a back conductor deposited on the semiconductor material.

* * * * *